United States Patent [19]

Tuttle

[11] Patent Number: 4,952,869
[45] Date of Patent: Aug. 28, 1990

[54] DUAL PURPOSE PROBE FOR SIMULTANEOUS VOLTAGE AND CURRENT SAMPLING

[75] Inventor: John E. B. Tuttle, Falls Church, Va.

[73] Assignee: The United States of America as represented by the Secretary of the Army, Washington, D.C.

[21] Appl. No.: 411,776

[22] Filed: Sep. 25, 1989

[51] Int. Cl.$^5$ .......................... G01R 1/20; G01R 33/06
[52] U.S. Cl. ..................................... 324/126; 324/127; 324/117 R
[58] Field of Search .................. 324/117 H, 126, 127, 324/117 R, 537; 336/200, 216, 217; 307/309; 338/32 R

[56] References Cited

U.S. PATENT DOCUMENTS

| | | | |
|---|---|---|---|
| 3,986,116 | 10/1976 | Smith et al. | 324/127 |
| 4,325,022 | 4/1982 | Pelletier | 324/127 |
| 4,706,017 | 11/1987 | Wilson | 324/127 |
| 4,748,405 | 5/1988 | Brodzik et al. | 324/127 |
| 4,855,671 | 8/1989 | Fernandes | 324/127 |

FOREIGN PATENT DOCUMENTS 2198543  6/1988  United Kingdom ................ 324/126

Primary Examiner—Ernest F. Karlsen
Assistant Examiner—Vinh P. Nguyen
Attorney, Agent, or Firm—Saul Elbaum; Guy M. Miller

[57] ABSTRACT

A dual purpose probe for the simultaneous sampling of the voltage and current at a test point. The device includes a capacitive probe for measuring voltage, and a small solenoid type inductor for measuring current when affixed so that it is at right angles to the wire being sampled. A small, double-sided circuit board has the inductor mounted thereon as well as a small metallic pick up plate which serves as one plate of a capacitor when the probe is affixed in the measuring position, while the conductor being sampled forms the other plate of the capacitor, and the insulation around the conductor serves as the capacitor dielectric.

9 Claims, 4 Drawing Sheets

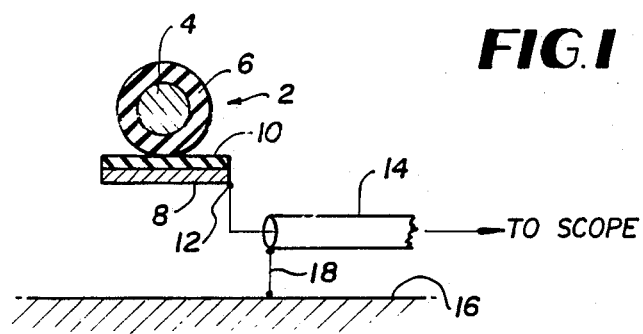
FIG.1
FIG.2
FIG.3
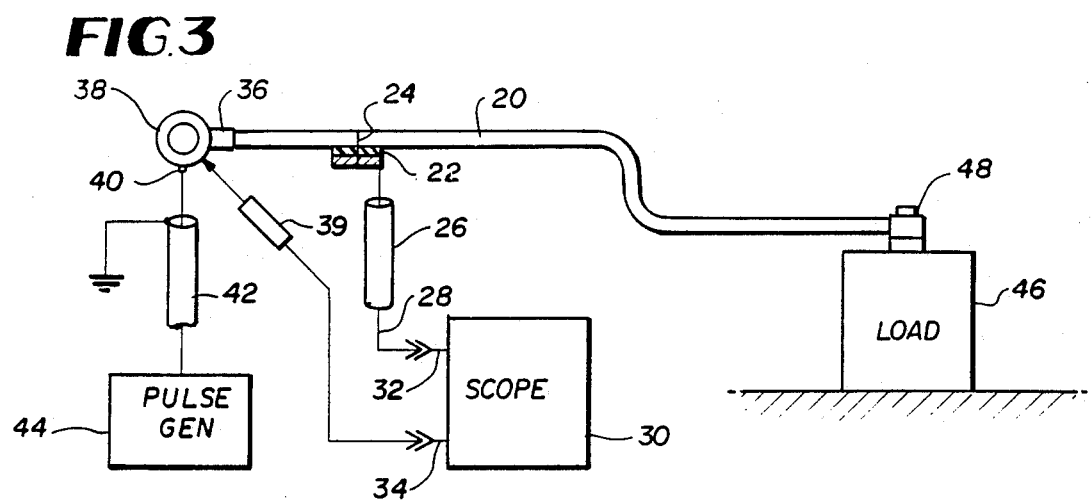
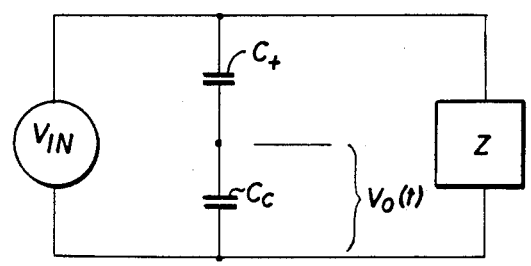
FIG.4

DUAL PURPOSE PROBE FOR SIMULTANEOUS VOLTAGE AND CURRENT SAMPLING

The present invention is directed to a dual purpose probe for the simultaneous sampling of current and voltage waveforms from the same measurement point.

The probe of the invention is designed to be used with an oscilloscope or other waveform recording instrument for pulse response measurements in laboratory, field test, and production line environments. The voltage sampling device is a capacitive pickoff which provides an attenuated replica of the test point waveform while the current sensing element is a small inductor which provides a voltage waveform proportional to the time varying current flowing in the conductor at the measurement point. Both sensing elements are contained within a small double sided circuit board which is strapped to the measurement point. The outputs of the probe are coupled to the recording instrument by miniature coaxial cable.

By way of background, attenuator voltage probes and RF current probes have been in wide industrial and laboratory use for many years. The most commonly used commercially available voltage probes are of the resistive voltage divider type which are available in fixed division ratios of 10:1, 100:1, and 1000:1. These require ohmic contact with the measurement point. Capacitive voltage divider probes are generally not available "off-the-shelf" but are sometimes built into high voltage pulse equipment for monitoring the diagnostics. These do not require ohmic contact with a test point. The most commonly used RF current probes for measurement of CW and pulsed currents are the toroidal clamp on types. These must physically surround the test point. The clamp on type current probes typically have outer diameters from 3 inches to 6 inches and window sizes from 1 inch to 3 inches.

The physical size, shape, and method of attachment to the test point make these voltage and current sensors difficult to use in confined spaces such as power distribution panels, connector entry panels, and small RFI shielded enclosures. Moreover, the per unit cost of these devices is very high.

It is thus an object of the invention to provide a small dual purpose probe for the sampling of voltage and current which easily and conveniently attaches to a test point.

It is a further object of the invention to provide a dual purpose probe which is inexpensive to manufacture.

In accordance with the invention, a dual purpose probe is provided which is comprised of a small double sided circuit board having a metallic pick off plate on one side and an inexpensive inductor disposed on the other side. The pick off plate comprises one plate of a capacitor while the other plate is formed by the conductor of the circuit point being monitored, and the dielectric is formed by the insulation which surrounds the conductor. This capacitor is formed when the probe is affixed in the monitoring position.

The probe as affixed is oriented so that the inductor, which is approximately cylindrical in shape is perpendicular to the wire being monitored, and the load seen by the inductor is arranged to be either a low valued resistance or a transmission line which is terminated by its characteristic impedance.

The electrical characteristics of the probe compare favorably with the larger and more expensive devices which they replace. Since these probes are very inexpensive to fabricate and can be made in large quantities, they can be used as permanently embedded sensors to cover many test points in a large system for diagnosis and monitoring. Thus, in addition to general laboratory use these probes may be used to provide permanent access to otherwise inaccessible test points in fielded military systems or industrial environments.

The invention will be better understood by referring to the following drawings wherein:

FIG. 1 is a schematic representation of the capacitive probe of the invention attached to an insulated conductor.

FIG. 2 is a simplified equivalent circuit of the capacitive probe of FIG. 1 attached to an insulated conductor and connected to an oscilloscope input.

FIG. 3 is a schematic representation of an arrangement for performing an in-situ calibration method.

FIG. 4 is an equivalent circuit of a probe being calibrated.

Figure 7:
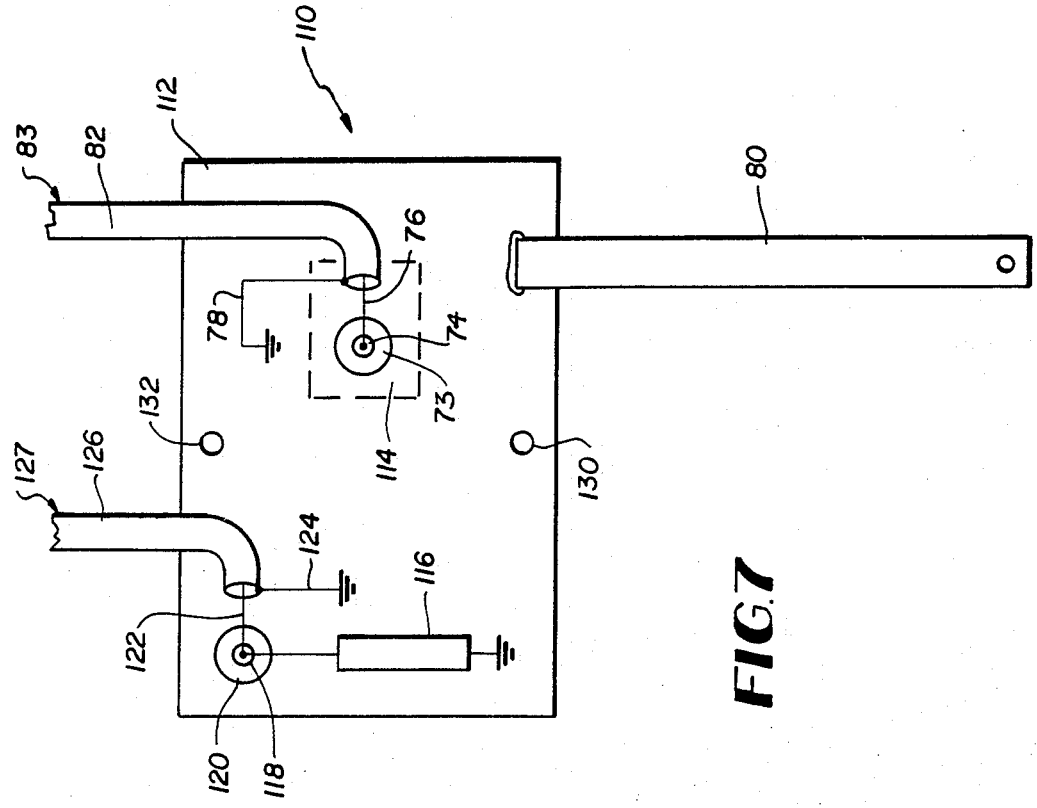
FIG. 7 is a schematic representation of the structure of the probe in accordance with an embodiment of the invention.

FIG. 1 is a simplified representation of the voltage sensing half of the dual probe. This is comprised of a capacitive probe which is made up of a probe tip and coaxial cable. The probe tip is made up of conductive plate 8 which is secured to the wire 2 to be sampled. The plates of the capacitor are formed by plate 8 and the conductor 4 of the wire being sampled, while the insulation 6 of the wire and tape 10 form the dielectric. The insulation provided by tape 10 is necessary in the case where the wire to be sampled is bare, i.e., has no insulation.

The time varying voltage is measured with respect to a reference such as ground plane 16. The capacitor plate 8 is connected to center conductor 12 of the coaxial cable while the outer conductor 14 is connected to ground. The coaxial cable is fed to the input of an oscilloscope.

FIG. 2 is a simplified equivalent circuit of the arrangement shown in FIG. 1. The tip capacitance, $C_t$, in FIG. 2, is formed by the test point wire and the tip of the probe.

$C_t$ will usually be unknown because it is dependent on the test point geometry and insulation materials, which are not controlled by the tester. The capacitance $C_c$ in FIG. 2 is the total coaxial cable capacitance from tip to scope input while $C_s$ and R are the capacitive and resistive inputs to the oscilloscope. $C_c$, $C_s$ and R will always be known. The transfer function of this simple probe can therefore be expressed as:

$$F = \frac{C_t}{C_t + C_c} = \frac{V_{out}}{V_{in}}$$

The fact that $C_t$ will be initially unknown need not trouble the tester since its value can be readily determined in situ. The method for in situ calibrations of the capacitive probe entails the injection of a low voltage calibration pulse into the test point and measurement of the probe output amplitude.

FIG. 3 shows a typical environment in which the capacitive voltage probe may be used and the setup for in situ calibration. The voltage probe 22 whose tip capacitance is to be measured is shown connected to the test point, an insulated wire 20, by strap 24. The test point conductor is shown disconnected at one end and a terminal 38 is connected to wire 20 at this end via stem 36. A pulse generator 44 is connected to terminal 38 via cable 42 and clip 40 to direct drive one end of the conductor, and a dual channel scope 30 is connected to terminal 38 by resistive probe 39, and is used to simultaneously display the calibration pulse and the probe output. The pulse generator is adjusted to provide a 10 volt rectangular pulse whose width and repetition rate provide a display convenient to the operator. At its other end, wire 20 is connected to impedance load 46, which is an impedance load for a power entry vault, and typically is a terminal protection device or a powerline filter.

The calibrating waveform and the sampled waveform are simultaneously displayed by the scope, and differ only in amplitude. By measurement of the peak voltages of the displayed waveforms, the unknown tip capacitance $C_t$ can be calculated from:

$$C_t = \frac{(V\,\text{cal}/V\,\text{probe})\,C_c}{1 - (V\,\text{cal}/V\,\text{probe})}$$

and the voltage division ratio can be calculated from:

$$A = \frac{V\,\text{cal}}{V\,\text{probe}} = \frac{C_t + C_c}{C_t}$$

The equivalent circuit representation of the arrangement of FIG. 3 is shown in FIG. 4.

Figure 5:
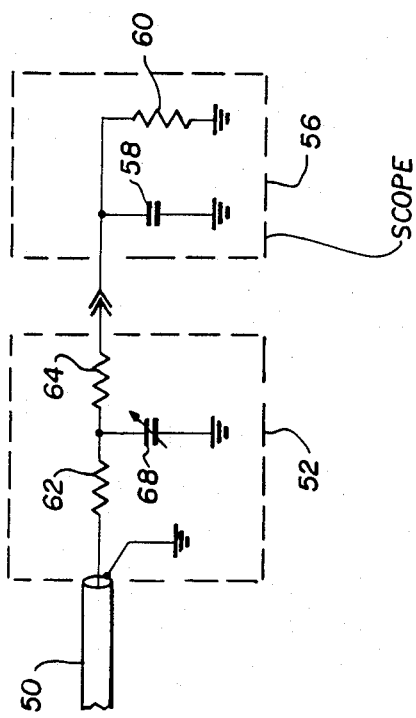
FIG. 5 is a circuit diagram of a compensating network to mitigate transmission line effects.

The probe description as presented so far has treated the coaxial cable as if it were a fixed capacitance and has ignored the transmission line properties of the cable. This was to simplify the explanation of the calibration procedure. Treatment of the probe in this manner would be acceptable if the bandwidths of the signals to be measured were below 20 MHz. In reality, this is not the case. In the applications considered for this probe, signals having bandwidths in excess of 70 MHz may be encountered. Therefore, the effects of probe cable length must be neutralized. To reduce these effects the probe cable is terminated in a compensation network as shown in FIG. 5.

The compensation network is comprised of resistors 62 and 64 of equal magnitude, and variable or fixed capacitor 68. In FIG. 5, the compensation network is shown as interconnecting probe 50 and scope 56, which has input capacitance 58 and input resistance 60.

Figure 6:
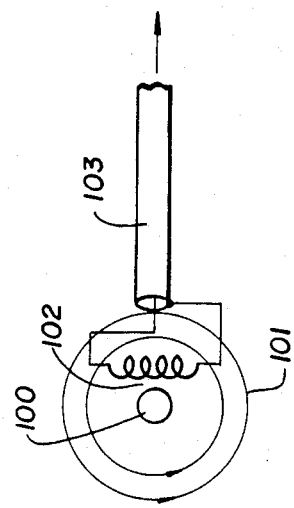
FIG. 6 is a schematic representation of the inductor of the probe of the invention sampling the time varying current in a wire.

The current sensing half of the dual probe is a small solenoid type inductor which is wound on a ferrite core. Such an inductor, as illustrated in FIG. 6, when placed at right angles to a conductor carrying a time varying current, will be excited by the lines of magnetic flux emanating from the conductor. Thus, in FIG. 6, inductor 102 is sampling the current flowing in wire 100 having magnetic field lines 101, and is terminated in transmission line 103. If the load "seen" by the excited inductor is a low valued resistance or a transmission line which is terminated in its characteristic impedance, the inductor will generate a voltage proportional to the time varying current flowing in the conductor. Thus, a ten microhenry single layer ferrite core inductor soldered to the end of a 50 ohm coaxial cable was found to have a 0.4 ohm transfer impedance and a flat frequency response characteristic between the limits of 2 MHz and 100 MHz. With the addition of a 5 ohm resistor in parallel with the inductor, the low frequency end of the frequency response characteristic was extended to 50 KHz at a cost of 23 db reduction in overall probe sensitivity. It was subsequently found that the frequency response characteristic could be extended well beyond 100 MHz by careful shielding of inductor leads.

Repeated experiments have shown that these inductors have excellent pulse response characteristics and may therefore be used for measurement of pulsed and CW currents.

The physical construction of an embodiment of the dual probe of the invention is depicted in FIG. 7. It is comprised of a small double sided circuit board 110 made of insulating material and having a conductive surface 112 such as a copper plate or copper foil on one side, and a small rectangular conductive pickup plate or foil 114 on the other side, which for example, may also be made of copper.

The conductive plate 112 is the ground plane of the device, while pickoff plate 114 is the pickoff plate for the capacitive probe, and serves as one plate of the capacitor which is formed when the device is secured to an insulated conductor. The center conductor 76 of the capacitive probe coaxial cable 83 is connected to the pickoff plate by being soldered to terminal 74 which is internally connected to the pickoff plate through the circuit board. A part 73 of the ground plane around terminal 74 is removed to avoid shorting the terminal to the ground plane, and the outer conductor of the coaxial cable is connected to the ground plane by conductor 78. Additionally, a braided strap 80 is provided, which may be used to connect the ground plane to the enclosure ground.

The current sensing element is inductor 116, which is connected between the ground plane and standoff solder terminal 118, which has the surrounding conducting area 120 removed to insulate it from the ground plane. The center conductor 122 of coaxial cable 127 is connected to the solder terminal 118, while the outer conductor 124 is connected to the ground plane.

In operation, the device is secured to the wire being sampled with Nylon cable ties which pass through holes 130 and 132. The device is secured so that inductor 116 is at right angles to the wire being sampled. In a preferred embodiment, the configuration of the circuit board was square, and its dimensions were 1.25" on each side.

In some instances it is advantageous to use the capacitive probe in combination with a resistive voltage divider probe and thus, three modes of operation as follows are available to the user:

A. capacitive voltage divider;
B. test point resistive probe adapter; and

C. capacitive divider - resistive probe tandem combination.

Modes A and B are used where the test point is easily accessible. However, where the probe is to be used as an embedded sensor to provide permanent access to an inaccessible test point (i.e. a shielded power entry vault) mode C should be used. Mode A is illustrated in FIG. 8, while modes B and C are illustrated in FIGS. 9 and 10 respectively, wherein like elements are identified with like numerals.

Figure 8:
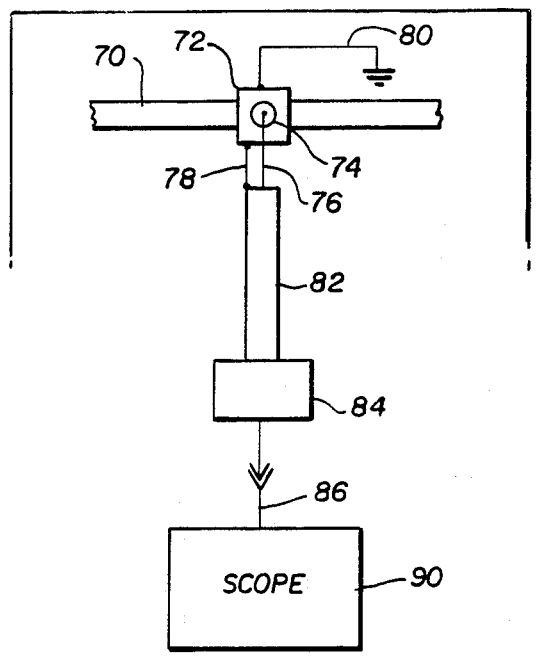
FIG. 8 is a schematic representation of the capacitive voltage probe of the invention coupled by coaxial cable to the oscilloscope.

Referring to FIG. 8, probe tip 74 is connected to coaxial cable 82, which is fed to scope 90 through compensation network 84.

Figure 9:
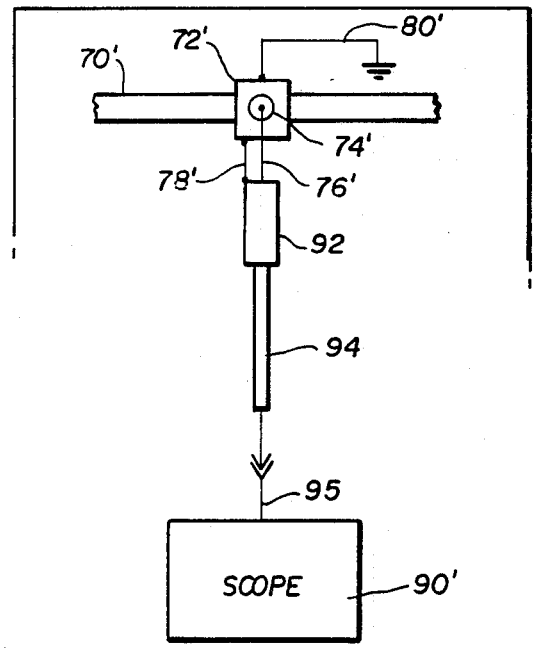
FIG. 9 is a schematic representation of the capacitive probe of the invention wherein the coaxial cable of the probe is replaced by a resistive probe.

Referring to FIG. 9, which illustrates mode B, the coaxial cable of the capacitive probe of FIG. 8 is replaced by single ended resistance probe 92, which has its own coaxial cable 94 which is connected to scope 90'. When the probe is used as an embedded sensor (mode C), the probe output must be accessible to test personnel via a panel jack on the wall of the enclosure containing the test point. To couple probe output from the panel jack to the input of an oscilloscope would create the requirement for a coaxial extension which would alter probe characteristics. Since the transmission line characteristics of the probe and the equivalent coaxial capacitance are dependent upon length of the probe cable, a straight coaxial extension from the panel jack to the scope input would be undesirable, and to circumvent this difficulty, a resistive voltage divider probe (10:1) is used to couple the signal from the panel jack to the scope input.

Figure 10:
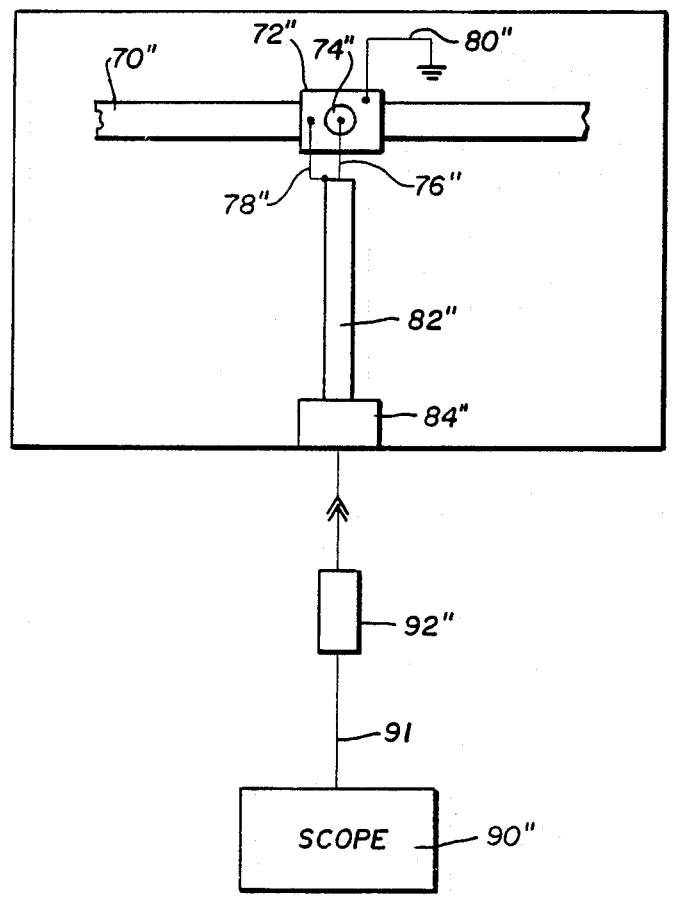
FIG. 10 is a schematic representation wherein a capacitive probe/resistive divider tandem combination is illustrated.

This is illustrated on FIG. 10, wherein capacitive probe 82" feeds compensation network 84", which is connected to single ended resistive voltage probe 92", which feeds scope 90".

There thus has been described a unique dual purpose probe which is more compact and inexpensive than prior devices.

While the invention has been described in accordance with illustrative embodiments, it should be understood that variations will occur to those skilled in the art, and the scope of the invention is to be limited only by the claims appended hereto and equivalents.

I claim:

1. A dual purpose probe for simultaneously sampling voltage and current from a predetermined circuit point along a conductor, comprising:
    a circuit board having two sides,
    a metallic pick up plate on one of said sides for acting as one plate of a capacitor which is formed when said metallic pick-up plate is placed adjacent to said predetermined circuit point, and
    an inductor disposed on the other side of said circuit board, said inductor having a load which is either a low valued resistance or a transmission line which is terminated in its characteristic impedance so that said inductor will become excited by the lines of magnetic flux emanating from the conductor.

2. The probe of claim 1 wherein said inductor is approximately cylindrical in shape.

3. The probe of claim 1 wherein said other side of said circuit board comprises a ground plane, said metallic pick up plate is connected to the center conductor of a length of a first coaxial cable while the outer conductor of the coaxial cable is connected to the ground plane, and wherein one side of the inductor is connected to the center conductor of a length of a second coaxial cable, while the other side of the inductor and the outer conductor of the length of the second coaxial cable are connected to the ground plane.

4. The probe of claim 3 wherein the metallic pick up plate comprises a rectangular plate of metallic foil.

5. The probe of claim 4, wherein the inductor comprises a solenoid type inductor.

6. The probe of claim 5 wherein the pick off plate is connected to the center conductor of the length of the first coaxial cable by connecting the pick off plate to a solder terminal on the same side of the board as the ground plane through a hole in the board, and by connecting the center conductor of the length of coaxial cable to the solder terminal.

7. The probe of claim 6 wherein the metal comprising part of the ground plane immediately in the area of the solder terminal is removed to preclude shorting of the solder terminal.

8. The probe of claim 7 wherein one side of the inductor is connected to the center conductor of a length of the second coaxial cable by connecting one side of the inductor to a solder terminal on the ground plane side of the board and by connecting the center conductor to the solder terminal.

9. The probe of claim 8 wherein the metal comprising part of the ground plane immediately in the area of the solder terminal to which the inductor is connected is removed to preclude shorting of the solder terminal.

* * * * *